United States Patent [19]
Shapiro

[11] Patent Number: 5,834,994
[45] Date of Patent: Nov. 10, 1998

[54] MULTILAYER LOWPASS FILTER WITH IMPROVED GROUND PLANE CONFIGURATION

[75] Inventor: Gary H. Shapiro, Albuquerque, N. Mex.

[73] Assignee: Motorola Inc., Schaumburg, Ill.

[21] Appl. No.: 785,496

[22] Filed: Jan. 17, 1997

[51] Int. Cl.⁶ .................................................. H01P 1/20
[52] U.S. Cl. ........................ 333/202; 333/204; 333/185
[58] Field of Search ................................... 333/176, 184, 333/185, 202, 204

[56] References Cited

U.S. PATENT DOCUMENTS

| | | | |
|---|---|---|---|
| 4,673,903 | 6/1987 | Saad .......................................... | 333/210 |
| 4,800,348 | 1/1989 | Rosar et al. .............................. | 333/202 |
| 4,896,124 | 1/1990 | Schwent ................................... | 333/206 |
| 5,075,650 | 12/1991 | Okamura et al. ..................... | 333/185 X |
| 5,173,671 | 12/1992 | Wendler et al. ......................... | 333/185 |
| 5,192,926 | 3/1993 | Sogo et al. .............................. | 333/204 |
| 5,319,328 | 6/1994 | Turunen ................................... | 333/202 |
| 5,357,227 | 10/1994 | Tonegawa et al. ..................... | 333/185 |
| 5,373,271 | 12/1994 | Hirai et al. .............................. | 333/205 |
| 5,446,430 | 8/1995 | Yamanaka et al. ..................... | 333/202 |
| 5,461,352 | 10/1995 | Noguchi et al. ........................ | 333/204 |
| 5,467,065 | 11/1995 | Turunen et al. ......................... | 333/132 |
| 5,479,141 | 12/1995 | Ishizaki et al. .......................... | 333/204 |
| 5,668,511 | 9/1997 | Furutani et al. ..................... | 333/185 X |

*Primary Examiner*—Seungsook Ham
*Attorney, Agent, or Firm*—Gary J. Cunningham; Colin M. Raufer

[57] ABSTRACT

A laminated lowpass filter (100) is disclosed. The filter (100) has: a stack of dielectric substrates (301–312) having a ground via (209); a pi network coupled between an input (202) and an output (202'); and the ground via (209) is conductively filled and extends substantially through the sheets of dielectric (301–312) connecting a first ground plane (102) to a second ground plane (104) and is spaced a predetermined distance between a first and a second leg of the pi network, to define an isolation barrier that substantially minimizes the passage of stray signals therebetween.

14 Claims, 4 Drawing Sheets

5,834,994

MULTILAYER LOWPASS FILTER WITH IMPROVED GROUND PLANE CONFIGURATION

FIELD OF THE INVENTION

This invention relates to multilayer ceramic packages, and more particularly, to a multilayer lowpass filter with improved ground plane configuration.

BACKGROUND OF THE INVENTION

Multilayer ceramic filters are known in the art. These filters discriminate between signals by passing signals in a desired, predetermined frequency band (i.e. pass the signal from the input to the output of the filter unattenuated), while preventing the transmission of signals on the high side of the predetermined frequency band. One problem with small multilayer packages is that as their size decreases, undesirable coupling occurs between internal circuit components resulting in "crosstalk" or "noise" which reduces the effectiveness of the filter. This may produce unwanted transmissions from portable radio and cellular communication products. The generation of "crosstalk" or "noise" results in the degradation of the performance of a system utilizing such filters.

Unwanted coupling also causes "flyback" in the area where harmonic rejection is required. Flyback is a term-of-art used to describe a situation where the filter response provides less attenuation after previously providing greater attenuation. For example, a filter response may only offer 10 dB of attenuation at a third harmonic due to coupling between internal capacitor components, whereas at the second harmonic, the attenuation may have been 20—30 dB. This flyback in the harmonic rejection region is generally undesirable.

FIG. 4 shows a frequency response curve (dashed line) for a prior art lowpass filter. As can be seen from FIG. 4, the insertion loss in the passband is approximately 0.40 dB which may be too great for certain digital cellular telephone or other electronic applications. The harmonic rejection values of 40 dB at both the second harmonic (F2) and the third harmonic (F3) do meet certain requirements, but these specifications cannot be achieved without an associated insertion loss value which is unacceptably high. For emerging digital telecommunication technologies, the prior art lowpass filters have too great an insertion loss value in the passband and can no longer meet the decreasing size requirements of cellular telephone and other electronic equipment manufacturers.

A multilayer lowpass filter with an improved ground plane configuration with a strategically positioned ground via, which has very low insertion loss in the passband and provides suitable harmonic rejection, in a small package and simple design, would be an improvement in the art.

DETAILED DESCRIPTION OF THE PREFERRED EMBODIMENT

Figure 1:
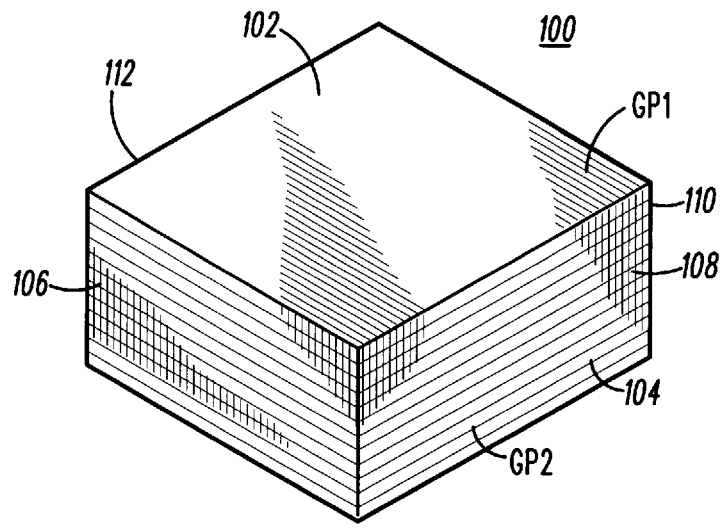
FIG. 1 shows a perspective view of a multilayer lowpass filter with improved ground configuration, in accordance with the present invention.

FIG. 1 shows a view of a multilayer lowpass filter 100 having a top surface 102, a bottom surface 104, and four side surfaces 106, 108, 110 and 112 respectively. This multilayer package is made from a stack of dielectric substrates which are then laminated under pressure and temperature and fired into a single ceramic multilayer package. The top surface 102 of filter 100 is substantially coated with a conductive material defining a top or first ground plane GP1. The bottom surface 104 is substantially covered with a conductive coating with the exception of an unmetallized area surrounding input and output pads defining a bottom or second ground plane GP2 (see description of FIG. 2 below). The side surface 106, 108, 110 and 112 of filter 100 are uncoated or unmetallized.

Figure 2:
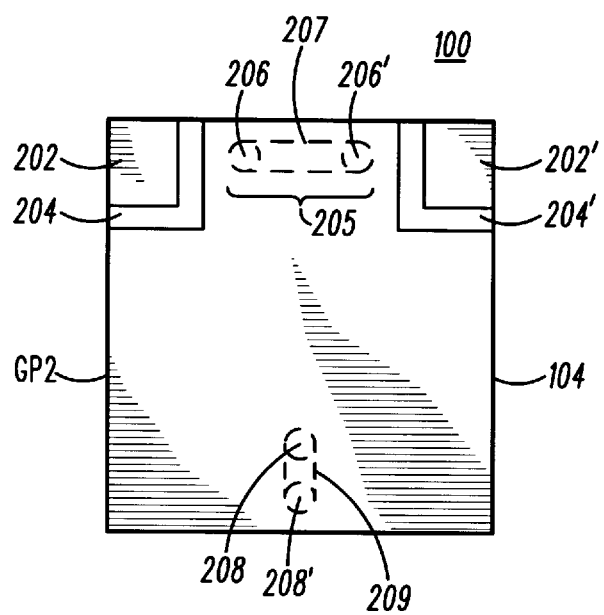
FIG. 2 shows a view of the bottom surface of the lowpass filter shown in FIG. 1, in accordance with the present invention.

FIG. 2 shows a view of the bottom surface 104 of filter 100. FIG. 2 shows an input pad 202 and an output pad 202', as well as ground vias 208, 208' and 206, 206' which provide the improved ground plane configuration of lowpass filter 100. Bottom surface 104 is substantially metallized with a conductive coating material forming a second ground plane GP2. The pair of input and output pads 202 and 202' are located at one end of the filter 100, and are surrounded by uncoated areas of dielectric material 204 and 204' respectively. This input-output configuration, as shown in FIG. 2, allows filter 100 to be easily surface mounted onto a printed circuit board using conventional manufacturing techniques. Also, this input-output configuration provides a ground plane in the form of a conductively coated area 205 immediately between the input and the output. This design, having a ground plane 205 directly between the input 202 and the output 202', provides the advantages of both isolation between the input and the output and sufficient harmonic rejection.

Strategically positioned ground vias 208, 208' and 206, 206' are shown in phantom in FIG. 2. These vias run from the bottom surface 104 to the top surface 102 of the filter 100 and are filled with a conductive paste material. Vias 208 and 208' form a first isolation barrier which (minimizes or prevents) the passage of unwanted stray signals between a first and second capacitance C1 and C2, in FIGS. 3 and 6. Vias 206 and 206' form a second isolation barrier which substantially minimizes or prevents the passage of unwanted stray signals between first and second input-output pads 202, 202' respectively.

In one embodiment, a single ground via 209 may be used, for simplicity of design. Similarly, a single ground via 207 may be used in place of ground vias 206 and 206'. The single via design may actually provide a suitable isolation barrier in many instances. However, in a preferred embodiment, there will be two via holes for the purposes of uniformity with other vias on the dielectric sheets and standardization of via punch equipment. Larger vias also require significantly more conductive paste material to fill the via which may be cost prohibitive in certain instances. A single, dual, or multiple ground via design may be employed, depending upon the specific application and specific filter design.

In lowpass filter 100, it is possible to integrate various circuit elements directly into the layers of the multilayer package. For example, resistors, capacitors, helical coils, transmission lines and inductors may be screen-printed or otherwise deposited directly onto the ceramic sheets, using a predetermined electrode pattern. Additionally, many of the layers of dielectric sheets may be printed with an electrode pattern or left unpatterned depending upon specific designs. Regardless of the specific design, any implementation of the improved ground plane configuration achieved through the strategic placement of a ground via is within the scope of this invention.

An important aspect of the present invention is a design which allows size reduction of the multilayer package, while simultaneously providing the desired harmonic rejection as well as low insertion loss inside the passband. A designer working in the field of multilayer package design is constantly forced to make a tradeoff between the harmonic rejection specification and the insertion loss inside the passband specification. Typically, a large amount of harmonic rejection can often be achieved, but it will come at the expense of insertion loss inside the passband. The ground plane configuration of the present invention allows both specification parameters, insertion loss and harmonic rejection, to be maximized.

Figure 3:
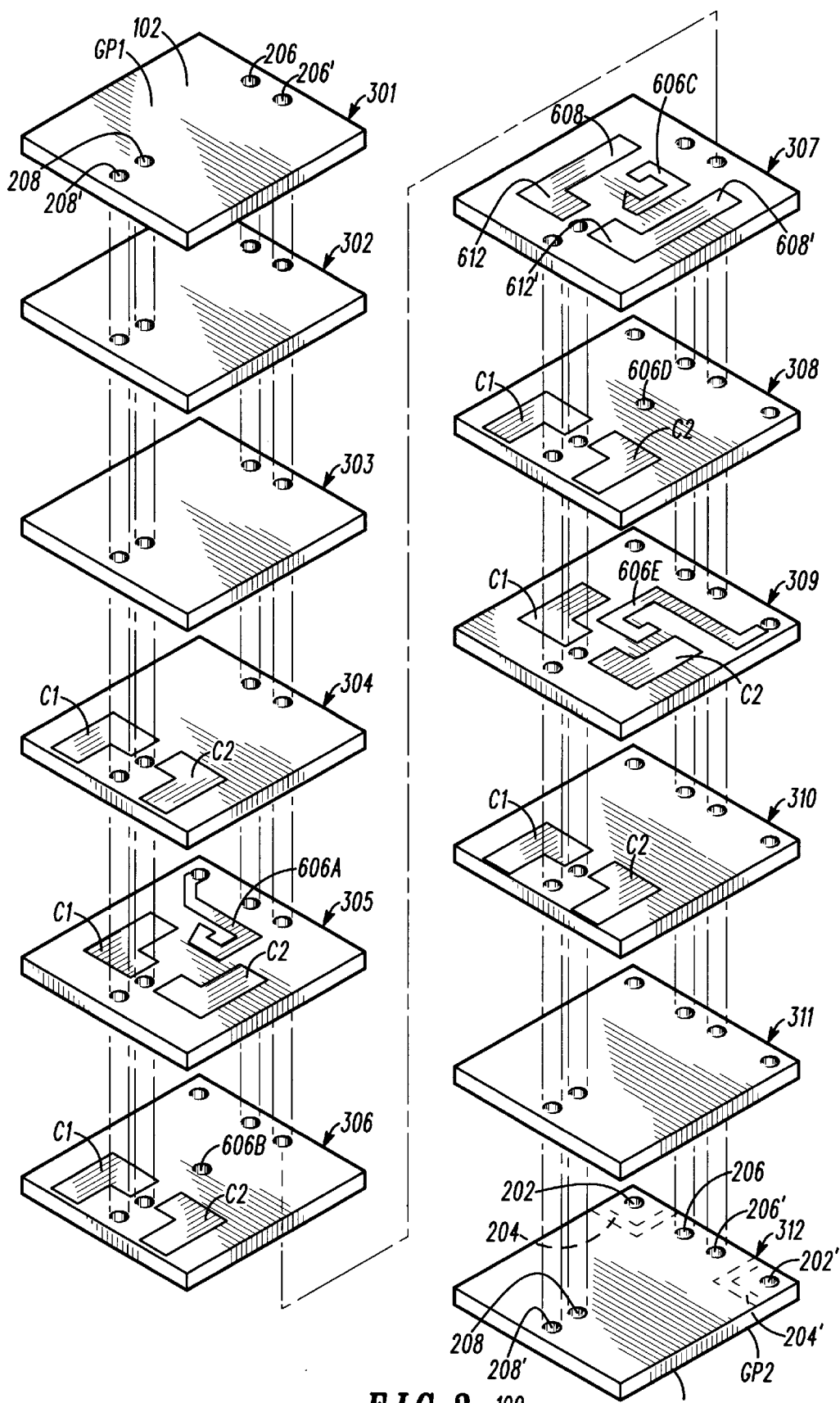
FIG. 3 an exploded perspective view of the lowpass filter of FIG. 1, in accordance with the present invention.

FIG. 3 shows an exploded view of filter 100, from which all electrode pattern layers and most of the conductively filled vias can be viewed. In FIG. 3, an internal transmission line runs through the multilayer package with electrode components on the surfaces of each dielectric sheet forming a traditional pi network circuit design. The pi network is positioned between the input pad 202 and the output pad 202' terminals. It is the pi network design that propagates the electromagnetic signal through the various layers in the multilayer lowpass filter package 100 to predetermined circuit elements. More specifically, the pi network design determines specifically which electrode components are positioned on each of the dielectric sheets 301–312.

Referring to FIG. 3, a series of twelve consecutive dielectric sheets numbered 301 through 312 are provided. The top sheet 301 of the package is conductively coated on its top surface 102 to provide a top or first ground plane (GP1) for the multilayer package. Also on sheet 301 are the strategically positioned ground vias, 208, 208' and 206, 206' which run through the lowpass filter 100 from its top surface 102 to the bottom surface 104. These strategically positioned ground vias 208, 208' and 206, 206' provide first and second isolation barriers respectively.

The strategic positioning of these ground vias around the electrode circuit elements, namely the capacitive elements C1 and C2 and a helical coil transmission line structure 606, provides for a design which offers very low insertion loss in the passband and suitably high harmonic rejection, in a very small package design. Moreover, the introduction of ground vias 208 and 208' between the capacitive elements C1, C2 substantially eliminates unwanted capacitance and undesirable crosstalk and noise. Consequently, the strategic positioning of a second isolation barrier formed by ground vias 206 and 206' around a helical coil transmission line structure 606 (a component of the pi network) results in lower insertion loss and greater harmonic rejection in lowpass filter 100.

In FIG. 3, the second and third sheets, 302 and 303 respectively, are not shown with an electrode pattern printed on them and are placed into the multilayer package in order to set a predetermined impedance (Zo) in the helical coil transmission line structure 606. Impedance (Zo) values are directly related to the package size and therefore the overall dimensions of the package may be varied to control impedance characteristics. The fourth sheet 304 of dielectric has two electrode capacitive elements C1 and C2 respectively deposited on its top surface.

As is typically the case in multilayer technology, a multilayer capacitor is formed by a series of parallel capacitive elements formed between alternate layers of dielectric material. In lowpass filter 100, a first capacitance (C1) is provided by a first plurality of metallized capacitor plates vertically aligned and selectively disposed on the stack of dielectric substrates. Similarly, a second capacitance (C2) is provided by a second plurality of metallized capacitor plates vertically aligned and selectively disposed on the stack of dielectric substrates. As such, the capacitive elements C1 and C2 on dielectric sheets 304, 306, 308, and 310 are connected to a common ground. Similarly, the capacitive elements C1 and C2 on dielectric sheets 305, 307, and 309 are also connected to a common connection point. When a potential difference is applied across the series of dielectric capacitive elements, they act as capacitors in the multilayer ceramic package. The conductive vias which interconnect the electrode circuit elements such as capacitive elements C1 and C2 are not shown in FIG. 3. However, the strategically positioned ground vias 208, 208', 206 and 206', are shown on each dielectric sheet 301–312 and their interconnection between each layer is shown as vertical dashed lines in FIG. 3.

The fifth sheet 305 of dielectric material also has two capacitive elements, C1 and C2 respectively, deposited on its top surface. Additionally, dielectric sheet 305 is the first sheet containing a layer of the helical coil transmission line structure 606A–606E located on sheets 305–309. Electrode pattern 606A on sheet 305 forms a first layer of the helical coil transmission line structure 606.

The sixth sheet 306 provides two electrode capacitive elements, 616 (C1) and 616' (C2) respectively. Also present on sheet 306 is a conductive via 606B which interconnects layers of the helical coil transmission line structure 606A–606E.

The seventh sheet 307 also contains two electrode capacitive elements, C1 and C2 respectively, as well as another electrode layer 606C of the helical coil transmission line structure 606A–606E located toward the central portion of sheet 307. Sheet 307 also significantly has deposited thereon a first transmission line 608 and a second transmission line 608'. The first capacitive element 612 and the second capacitive element 612' are strategically positioned on sheet 307 at the ends of transmission lines 608 and 608'. Capacitive elements 612 and 612' are aligned with the electrode capacitive elements C1 and C2 found on dielectric sheets 304–310.

The eighth sheet 308 has two electrode capacitive elements, C1 and C2 deposited thereon. Sheet 308 also contains a conductive via 606D to interconnect the helical coil transmission line structure 606A–606E.

Sheet 309, the ninth sheet, has two electrode capacitive elements C1 and C2 deposited on its top surface. Additionally, sheet 309 has a layer of the helical coil transmission line structure 606E located toward the central portion of sheet 309.

The tenth sheet 310 has two electrode capacitive elements C1 and C2 deposited on its top surface. The eleventh sheet 311 has no electrode pattern, however, it does contain ground vias 206, 206', 208 and 208' which are filled with a conductive material and pass substantially perpendicularly through every sheet 301–312. The twelfth and final sheet 312 has an input pad 202 and an output pad 202' positioned on its bottom ground plane surface 104 (GP2). The bottom surface 104 also serves as a bottom ground plane GP2.

The method by which the lowpass filter 100 operates can be seen with reference to FIG. 3. The ground vias 206, 206' and 208, 208' are shown in FIG. 3, and their positioning substantially on top of each other is shown by dashed lines. Note that other conductive transmission line vias, however, are also placed throughout the filter 100 to connect the internal electrode components such as C1 and C2. These vias are not shown in FIG. 3 so that the significant ground plane vias may be shown clearly.

Another feature of the multilayer package of lowpass filter 100 which is not readily apparent from FIG. 3 is the fact that the embedded capacitive elements C1 and C2 are made up of alternately stacked electrode portions which form two separate and distinct multilayer capacitor plates. More specifically, the capacitive elements C1, C2 on dielectric sheets 304, 306, 308 and 310 have a common electrical ground. The capacitive elements C1, C2 on sheets 305, 307 and 309 also have a separate common electrical connection point. As was stated previously, with alternate capacitive element layers having alternate polarities, a multilayer capacitor effect may be realized. As such, capacitive elements C1 and C2, also referred to as capacitors or capacitive electrode patterns or capacitor plates C1 and C2, are formed inside the lowpass filter 100 multilayer package.

One advantage of the present design is that only a few components are utilized as elements in the filter 100. More specifically, the filter 100 shown in FIG. 3 contains only five elements in the multilayer package, namely a pair of capacitor plates C1 and C2, two transmission lines 608, 608', and a helical coil transmission line structure 606. This is notable because from a design perspective, the addition of elements in a structure leads to improved harmonic rejection at the expense of increasing insertion loss inside the passband of interest. Stated another way, the simple design of filter 100, with a limited number of elements, allows for the low insertion loss value inside the passband to be achieved, while also providing suitable harmonic rejection outside of the passband.

Referring once again to FIG. 3, it is oftentimes necessary to include additional layers or sheets of the dielectric tape material in order to create a package having a predetermined dimensions. See, for example, sheets 302, 303, and 311 in FIG. 3. When this is necessary, one specific sheet will be repeated consecutively in the package. For example, in one embodiment of this invention, the design of the top sheet of the package is repeated three times to achieve a predetermined package thickness dimension. In this example, only the top sheet will be coated with a conductive material to create a ground plane, and the other sheets only serve to add volume to the package. Another reason it may be necessary to place additional sheets into the package is to set the proper impedance (Zo) and capacitance values (C1 and C2), or to increase the overall electrical length. The introduction of additional dielectric sheet layers is still another design option which can be utilized by the designer on an application specific basis.

A major factor which provides the desirable low loss characteristics found in the present filter is the introduction of the ground plane configuration which isolates the circuit elements and also allows for a small package design. With this ground plane design, the lowpass filter may offer reduced passband insertion loss while also maintaining adequate harmonic rejection.

Figure 4:
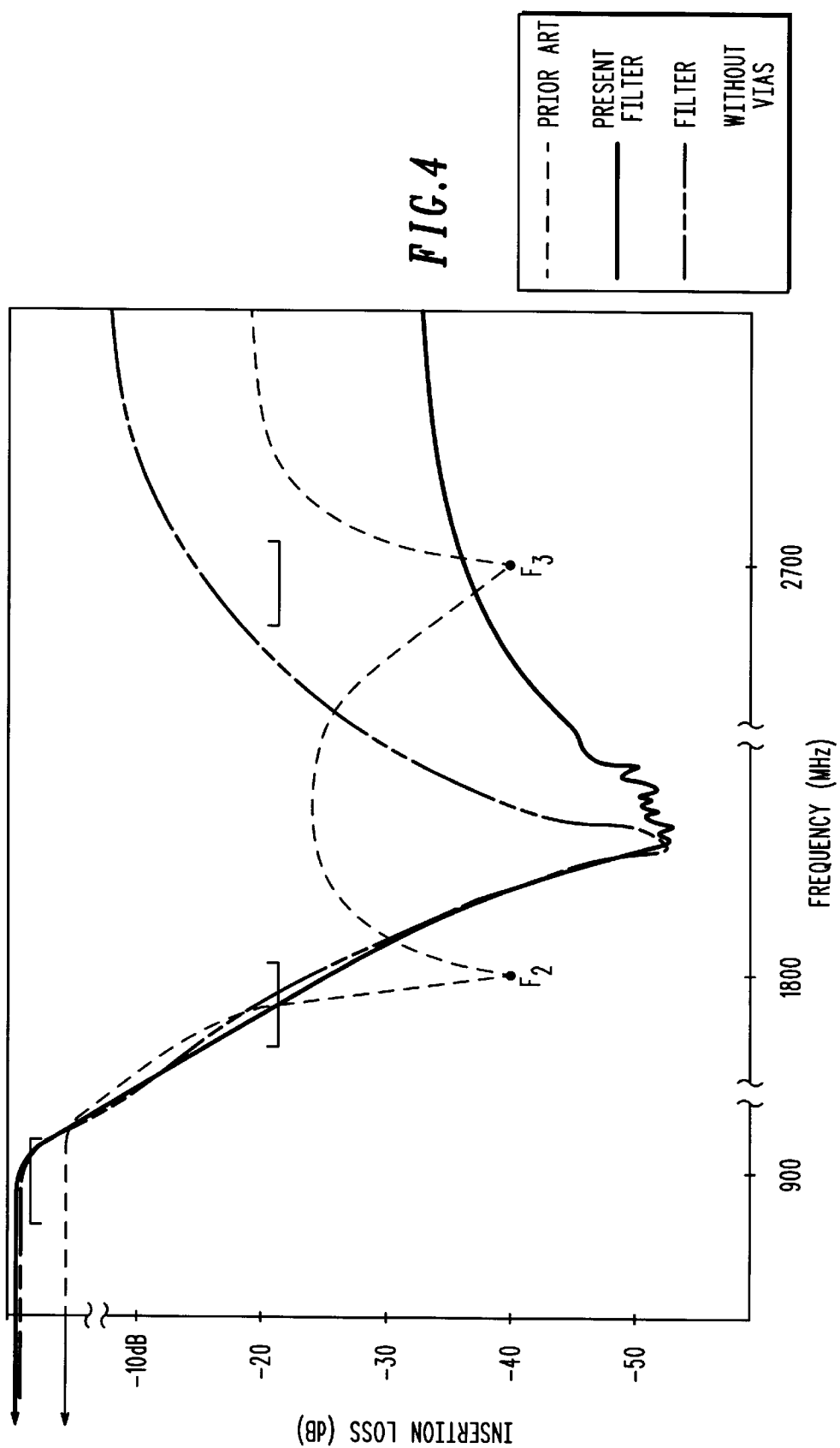
FIG. 4 flows a graph with frequency responses for a prior art lowpass filter, a lowpass filter without a ground via and with ground vias, in accordance with the present invention.

One specific example of the advantage which is offered by the ground plane configuration of the present invention can be seen with reference to FIG. 4 which shows a typical prior art frequency response curve as well as the frequency response curve for the lowpass filter design with and without ground vias. The present invention shows a harmonic filter having dimensions of about 0.135 inches by 0.138 inches by about 0.044 inches as shown in example one below. A decrease in the dimensions of the filter package leads to some design challenges as the internal circuitry becomes more compact and the internal components inside the multilayer package move closer together. Lowpass filter 100 addresses these challenges by providing strategically positioned ground vias 208, 208' and 206, 206' in the multilayer package.

Referring to FIG. 4, three frequency response curves are shown. Insertion loss (measured in dB) is provided along the vertical axis and frequency (measured in MHz) is provided along the horizontal axis. The first curve, shown as a dashed line, is a substantially accurate representation of the frequency response curve for a prior art lowpass filter, from Murata part number LFK30-05E0902L025. The second curve, shown as a series of small "x" characters, is a substantially accurate representation of the frequency response curve of slow pass filters without ground vias. Although insertion loss values for this design are very low inside the passband, the insertion loss at the third harmonic (F3) is undesirably high.

The third curve, shown as a solid line, is a substantially accurate representation of the frequency response curve for the present filter design with at least one ground via. This response shows a combination of low insertion loss in the passband and good harmonic rejection at the second (F2) and third (F3) harmonics.

Typically a fundamental frequency (fo) of the passband is located at the edge of the passband near a transition point on the frequency response curve. In FIG. 4, the fundamental frequency (fo) for the lowpass filter 100 is at approximately 900 MHz. The insertion loss specification is measured in this region. At the cutoff frequency (fc), the filter response starts to exhibit loss and it is in this region that the transition occurs between the bandpass region and the rejection region (where the attenuation is greater). In a preferred design, the slope will be great in the region around cutoff frequency (fc), such that there is a sharp contrast between the passband region and the rejection region.

In FIG. 4, the frequency response curve (shown as a solid line) for filter 100 provides an insertion loss of approximately 0.25 dB while simultaneously providing harmonic rejection of at least about 20 dB (or more) at 1800 MHz (the second harmonic) and at 2700 MHz (the third harmonic). This provides a desired frequency response with low loss in the passband and suitable harmonic rejection, which is particularly desirable for certain applications.

One particularly useful application for the present lowpass filter design is for digital cellular telephones. Whereas typical analog cellular telephones must contend with many harmonics, digital cellular telephones have a power amplifier which runs in a linear mode. Typical analog cellular telephones have a power amplifier designed to run at saturation. As such, a digital cellular telephone has fewer harmonics to contend with (relative to an analog cellular telephone), resulting in a harmonic rejection specification which is not as rigid or strict, resulting in a filter design where a lowpass filter having very low insertion loss inside the passband is desirable. The present invention provides a lowpass filter which offers both harmonic rejection and very low loss in the form of low insertion loss values inside the passband.

The lowpass filter 100 may be used between an antenna and a duplex filter or between an antenna and a switch in a digital cellular telephone. In this application, the lowpass filter will provide a low loss path for both the transmit and receive signal. Another application for this lowpass filter can be a low loss path for the transmit signal which is positioned immediately following the power amplifier in a digital cellular telephone. Still another application includes placement of a lowpass filter in a transceiver circuit between an antenna and at least one of a power amplifier and a receiver.

As should be understood by those skilled in the art, the ground plane configuration as shown in lowpass filter 100 may also be used for the design of filters at other frequencies. For example, in addition to 900 MHz, a lowpass filter at 1800 MHz, 1900 MHz, or other frequencies in the electromagnetic spectrum are also contemplated by the present invention.

The lowpass filter 100 employs a "pi" network design which is made from a series helical transmission lines, and two shunt capacitors (capacitive elements C1 and C2). The two shunt capacitors are formed when an electrode metallization pattern is positioned on a surface of a dielectric substrate in the multilayer package. Transmission zeros are realized by resonance of the shunt capacitors with their leader and via inductance. The pi network is better understood with reference to FIG. 6 discussed later in this specification.

Another advantage of the filter 100 is that the ground plane configuration allows for a very small package design in which there is substantially no cross-talk or noise because stray capacitance between the shunt capacitors or capacitive elements C1 and C2 is substantially minimized (or eliminated). This is significant because a necessary consequence of reduced package size is a design where capacitive elements C1 and C2 (also called shunt capacitors) must be in close proximity to each other on the dielectric sheet. An unfortunate result of moving these capacitors close to each other is that they couple energy to each other and provide paths for harmonics to be transmitted from input to output.

This reduction in size is accomplished by the addition of ground vias 208, 208' positioned between capacitive elements C1 and C2. These ground vias provide adequate isolation between these capacitor circuit elements. In summary, the ground vias 208, 208' are positioned between the capacitor electrode elements C1 and C2 and are electrically connected to both the top and the bottom ground planes GP1 and GP2. Additionally, the ground plates of the electrode capacitors are electrically connected to both the top and the bottom ground planes. As a result, since the two ground via stacks are connected, the top and bottom grounds are at substantially equal potential.

By strategically positioning the ground via 209 or ground vias 208, 208' between the electrode capacitive elements in the multilayer package, the two ground planes GP1 and GP2 are held at equal potential and, as a result, there is no cross-talk or stray capacitance between the capacitive elements. Stated another way, this design has full top-to-bottom ground vias 208, 208' which yield significant improvement in harmonic rejection.

The helical design is still another important aspect of this design. The helical design is achieved by providing metallization patterns in the form of transmission lines on each of the many multilayer sheets of dielectric material to form a helical coil transmission line structure (606 in FIG. 6). The electrical path is completed when connection vias (not shown in FIG. 3) are placed in the dielectric sheets to connect successive layers of electrode patterning.

A new and different ground plane configuration is also present in the helical design of the present invention. By strategically isolating the helical coil transmission line structure 606 with ground vias 206, 206', electrical isolation is substantially achieved and stray parasitic electrical signals are substantially virtually eliminated. The unique ground plane configuration of the present design can be applied to prevent unwanted coupling between capacitor circuit elements C1 and C2, but also to electrically isolate the helical coil transmission line structure 606. This is achieved by the strategic positioning of the conductive ground vias 206, 206' at fixed distances from the helical coil transmission line structure 606. In one embodiment, the ground vias 206, 206' are strategically positioned substantially between the input 202 and the output 202'.

In a preferred embodiment, the ground plane vias will be made from a silver (Ag) material. Of course, any conductive material may be used for the ground vias provided the conductive material is adaptable to multilayer processing requirements and can be produced in a form that may be readily used as a via filling material. Other possible conductive materials can include platinum (Pt), copper (Cu) and gold (Au).

Figure 5:
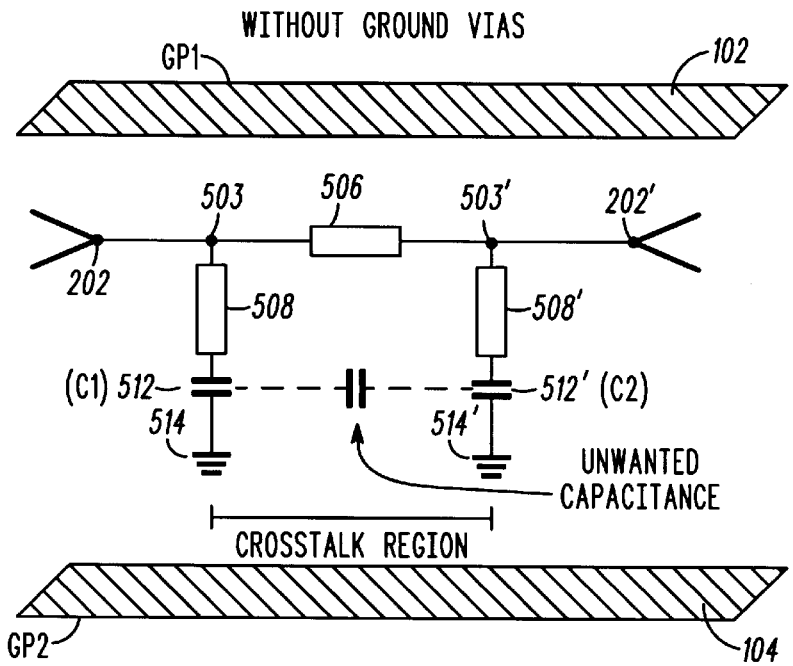
FIG. 5 shows an equivalent circuit diagram for a lowpass filter without a ground vias.
Figure 6:
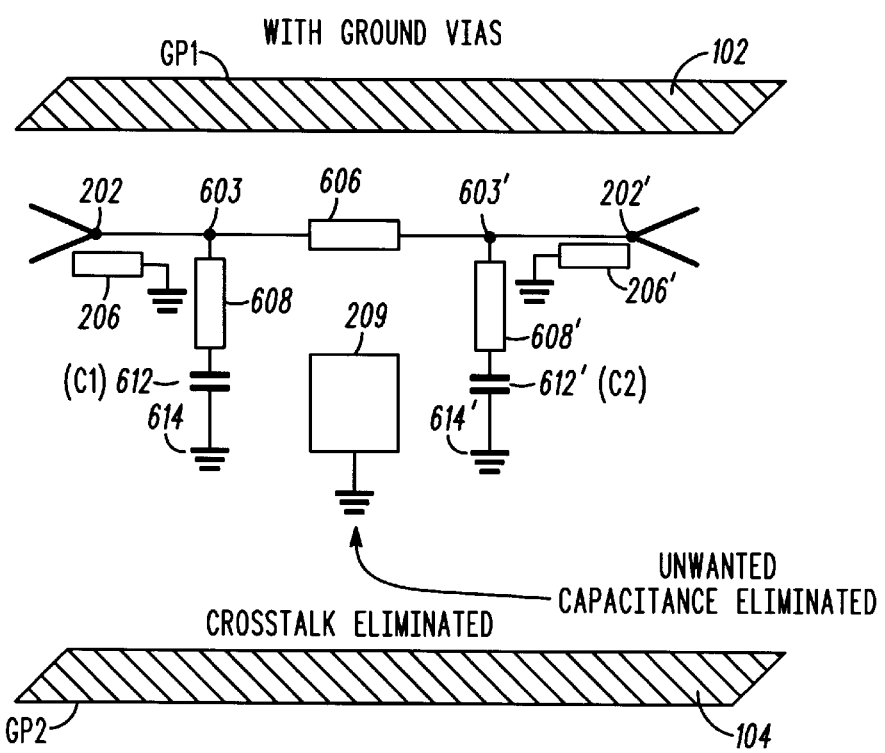
FIG. 6 shows an equivalent circuit diagram for a lowpass filter with at least one strategically positioned ground via, in accordance with the present invention.

FIGS. 5 and 6 show substantially equivalent circuit diagrams for filter without and with the ground vias 208, 208' (first isolation barrier) and 206, 206' (second isolation barrier), respectively. As can be seen from FIG. 6, the introduction of the ground planes can eliminate crosstalk by eliminating unwanted capacitance. The elimination of this unwanted capacitance also has the desirable effect of improving the overall attenuation of the filter.

Referring to FIG. 5, an equivalent circuit diagram of a lowpass filter design without at least one ground via is provided. A helical coil transmission line structure 506 is placed in line between an input 202 and an output 202'. A short transmission line 508 and a capacitance to ground 512 are located between input 202 and helical coil transmission line structure 506. Similarly, a short transmission line 508' and a capacitance to ground 512' are located between the output 202' and helical coil transmission line structure 506. Node 503 is in-line between input 202 and helical coil transmission line structure 506. Node 503' is in-line between helical coil transmission line structure 506 and output 202'. The entire circuit is placed between a first or top ground plane GP1 on a top surface 102 and a second or bottom ground plane GP2 on a bottom surface 104.

A challenge involves preventing unwanted capacitance 510 from propagating between the capacitive elements and disrupting the performance of the system by creating noise or crosstalk. This stray or undesirable and unwanted capacitance can be effectively eliminated by strategically positioning a ground plane via 209 between the capacitor plates C1 and C2 in the multilayer lowpass filter 100 package, as shown in FIGS. 2, 3 and 6.

FIG. 6 shows a simplified equivalent circuit diagram for a lowpass filter 100 with at least one ground via. In FIG. 6, a pi network design is provided. More specifically, the pi network is coupled between an input 202 and an output 202', comprising: a first leg including a first transmission line 608 and a first capacitance (or C1) 612 connected to ground 614; a second leg including a second transmission line 608' and a second capacitance (or C2) 612' connected to ground 614'; a middle section including a transmission line 606 between the first and second legs; a first node 603 coupling the input 202, the middle section and the first leg; and a second node 603' coupling the output 202', the middle section and the second leg. The first isolation via 209 is shown in FIG. 6, between the first and second legs. The second isolation vias 206, 206' are shown between the input 202 and the output 202'. The entire pi network circuit is placed in a multilayer between two ground planes GP1 on surface 102 and GP2 on surface 104. As this circuit shows, the strategic positioning of ground via 209 effectively substantially eliminates unwanted capacitance 510 and the crosstalk region is eliminated. A filter 100 with better performance characteristics and minimal or no crosstalk or noise between the capacitor plates C1 (612) and C2 (612') results from the introduction of ground via 209 (or ground vias 208, 208'). Still another embodiment of the present invention contemplates a ground plane configuration design in which a first leg is grounded to a first ground plane and a second leg is grounded to a second ground plane.

The multilayer lowpass filter with improved ground plane configuration may be manufactured as follows:

A stack of green dielectric substrates are prepared and via holes are punched into these sheets at predetermined locations on the sheets. Dielectric ceramic green tape may be purchased directly from tape vendors or custom-formulated using a doctor-blade forming technique.

Conductive pastes are then screen printed on the dielectric substrates in predetermined patterns. Although screen printing is a common deposition technique in the industry, other deposition techniques may be employed.

The input pad 202 and the output pad 202' are then patterned on the exterior bottom surface 104 of the filter 100 using conventional screen printing or other pattern deposition techniques (see FIG. 2).

Then the dielectric green sheets are laminated together under a pressure of approximately 4500–5000 pounds per square inch (PSI) and a temperature of approximately 65–70 degrees Celsius using standard multilayer processing equipment.

Next, the entire laminated package is then fired at a temperature of approximately 870 degrees Celsius for complete densification of the package. By this firing process, the pressure adhering of the laminated dielectric sheets is secured and the conductive pastes are bonded to the dielectric sheets to form electrode patterns.

Next, the filters are tested to insure that all electrical specifications have been met and that the filters are free of physical defects such as cracking, delamination, uneven coating, or electrically shorted input and output pads.

Finally, the filters are packaged and sent to the customer.

EXAMPLE ONE

Several lowpass filters substantially as shown in FIG. 3 were manufactured and twenty were randomly tested. The design specifications were that a harmonic rejection of 20 dB or more outside the passband and an insertion loss of 0.35 dB or less inside the passband in the frequency range of 900 MHz. These filters were manufactured substantially as shown in FIG. 3, using twelve sheets of dielectric ceramic tape, each sheet or layer having a distinct electrode pattern deposited thereon. Each sheet was approximately 0.045 inches thick in its unfired state and approximately 0.04 inches thick in its fired state. The overall fired dimensions of the filters were about 0.14 inches by about 0.14 inches by about 0.05 inches, which is substantially smaller than many other lowpass filter packages available in the industry. A silver (Ag) conductive paste material was used to form the electrode patterns inside the multilayer package as well as the ground planes GP1, GP2.

The filters were then tested for electrical performance and the solid line frequency response substantially as shown in FIG. 4 was provided. (This response is a simplified representation of the 20 tested filters.) FIG. 4 shows a solid line response (simplified version) of the actual frequency response curve for the lowpass filter of FIG. 3. The actual frequency response showed a slight hump at the edge of the passband in the region of the fundamental frequency (fo). This hump is not apparent at the scaled dimensions of FIG. 4. More significantly, the filters substantially as shown in FIG. 3, provided an insertion loss value of about 0.25 dB inside the passband which was significantly better than other lowpass filters in the industry, and an average rejection at the second and third harmonic of about 28 dB and 35 dB, respectively, which met the design specifications.

The solid horizontal lines in FIG. 4 are "limit lines" which set the required limits for the specifications. As can be seen from FIG. 4, these limit lines, each approximately 25 MHz wide, show that the solid line of the present invention met or exceeded the specifications.

EXAMPLE TWO

Another embodiment of the lowpass filter of the present invention was designed to perform at a passband frequency of approximately 1900 MHz for PCS1900 (Personal Communication System) applications, substantially as shown in FIG. 3. A frequency response, substantially as shown in FIG. 4, was obtained. The manufacturing processes and materials used were substantially the same as described in example one. The specification requirements were substantially the same as those of example one. The specification called for an insertion loss of 0.35 dB inside the passband and a harmonic rejection of 20 dB at the second and third harmonics.

A larger sample lot of 800 filters were tested for their electrical performance. Although parts may have been rejected for reasons such as improper metallization, cracks, delamination, etc., substantially all parts manufactured and sent to the customer met the electrical specifications, as detailed above.

For the sample lot, the average insertion loss inside the passband was 0.26 dB with a standard deviation of 0.02. This is well below the required specification of 0.35 dB. The average rejection at the second harmonic was 27 with a standard deviation of 2.44. This also exceeded the specification which required a harmonic rejection of 20 dB. These filters exceeded the electrical specification requirements.

COMPARATIVE EXAMPLE ONE

The lowpass filter 100 was compared with a lowpass filter shown in a Murata Mfg. Co, Ltd. product catalog. Murata's lowpass filter part number LFK30-05E0902L025, having a nominal center frequency of 902.5 MHz and a bandwidth of 25 MHz is representative of lowpass multilayer filters commercially available. The Murata filter had package dimensions of about 0.17 inches (4.5 mm) by 0.126 inches (3.2 mm) by about 0.079 inches (2.0 mm), which although very small is still larger than the filter of the present invention. More significantly, insertion loss at (25 degrees Celsius) was 0.85 dB pursuant to the Murata datasheet. This Murata filter has an insertion loss value which is substantially greater than the present filter, and which is unacceptably high for many developing digital cellular telephone and other telecommunication and electronic applications.

COMPARATIVE EXAMPLE TWO

The low pass filter of Example One with an equivalent circuit as substantially as shown in FIG. 5, was made without the ground vias as shown in FIG. 3. The frequency response in FIG. 4, did not meet the specifications at the third harmonic.

Although various embodiments of this invention have been shown and described, it should be understood that variations, modifications and substitutions, as well as rearrangements and combinations of the preceding embodiments can be made by those skilled in the art without departing from the novel spirit and scope of this invention.

What is claimed is:

1. A laminated lowpass filter comprising:
   a stack of dielectric substrates having a first-top substrate and a second-bottom substrate at respective ends thereof, and at least one ground via and a first-top ground plane disposed on a first major surface of the first-top substrate and a second ground plane disposed on the second-bottom substrate;
   a pi network disposed on the stack of dielectric substrates coupled between an input pad and an output pad, comprising:
      a first leg including a first transmission line and a first capacitance connected to the first-top ground plane, the first capacitance provided by a first plurality of metallized capacitor plates vertically aligned and selectively disposed on the stack of dielectric substrates;
      a second leg including a second transmission line and a second capacitance connected to the second ground plane, the second capacitance provided by a second plurality of metallized capacitor plates vertically aligned and selectively disposed on the stack of dielectric substrates;
      a middle section including a transmission line between the first and second legs;
      a first node coupling the input pad, the middle section and the first leg;
      a second node coupling the output pad, the middle section and the second leg;
      the at least one ground via being conductively filled and extending substantially through each of the stack of dielectric substrates connecting the first-top ground plane to the second-bottom ground plane and the at least one ground via being spaced a predetermined distance between each of the first plurality of metallized capacitor plates and the second plurality of metallized capacitor plates, defining an isolation barrier which substantially minimizes the passage of unwanted electrical signals therebetween.

2. The laminated lowpass filter of claim 1, wherein the at least one ground via comprises a plurality of substantially vertically aligned conductively filled ground vias substantially parallel to each other and disposed to create a continuously conductive passage from the first-top ground plane to the second-bottom ground plane.

3. The laminated lowpass filter of claim 2, wherein the plurality of substantially vertically aligned conductively filled ground vias are strategically positioned substantially between the first capacitance and the second capacitance.

4. The laminated lowpass filter of claim 3, further comprising at least one additional via strategically positioned between the first-top ground plane and the second-bottom ground plane and extending substantially vertically between the input pad and the output pad to provide a predetermined impedance.

5. The laminated lowpass filter of claim 4, wherein the plurality of substantially vertically aligned conductively filled ground vias and the at least one additional via are strategically positioned providing a filter having an insertion loss in the range of approximately 0.25 dB in a passband at frequencies of at least one of 900 MHz, 1800 MHz and 1900 MHz.

6. The laminated lowpass filter of claim 1, wherein both the first leg and the second leg are grounded to both the first-top and the second-bottom ground planes respectively.

7. The laminated lowpass filter of claim 1, wherein the first leg is grounded to the first-top ground plane only and the second leg is grounded to the second-bottom ground plane only.

8. The laminated lowpass filter of claim 1, wherein the first-top ground plane and the second-bottom ground plane are substantially equal potential ground planes.

9. The laminated lowpass filter of claim 1, wherein the stack of dielectric substrates substantially comprise ceramic dielectric materials.

10. The laminated lowpass filter of claim 1, disposed in a cellular telephone and coupled to an antenna.

11. The laminated lowpass filter of claim 1, coupled between an antenna and a power amplifier.

12. The laminated lowpass filter of claim 1, wherein said transmission line between the first and second legs comprises a helical transmission line having a plurality of metallized annular transmission lines vertically aligned and selectively disposed on the stack of dielectric substrates.

13. The laminated lowpass filter of claim 1, wherein the second-bottom substrate further comprises said input pad and said output pad.

14. The laminated lowpass filter of claim 13, further comprising at least one additional ground via strategically positioned between the first-top ground plane and the second-bottom ground plane and extending substantially vertically between the input pad and the output pad.

* * * * *